(12) United States Patent
Wu et al.

(10) Patent No.: US 11,601,763 B2
(45) Date of Patent: Mar. 7, 2023

(54) LATERAL MODE CAPACITIVE MICROPHONE INCLUDING A CAPACITOR PLATE WITH SANDWICH STRUCTURE FOR ULTRA HIGH PERFORMANCE

(71) Applicants: Guanghua Wu, Dublin, CA (US); Xingshuo Lan, San Jose, CA (US)

(72) Inventors: Guanghua Wu, Dublin, CA (US); Xingshuo Lan, San Jose, CA (US)

(73) Assignee: GMEMS TECH SHENZHEN LIMITED, Shenzhen (CN)

( * ) Notice: Subject to any disclaimer, the term of this patent is extended or adjusted under 35 U.S.C. 154(b) by 287 days.

(21) Appl. No.: 16/885,271

(22) Filed: May 28, 2020

(65) Prior Publication Data
US 2020/0296519 A1 Sep. 17, 2020

Related U.S. Application Data

(63) Continuation-in-part of application No. 15/730,732, filed on Oct. 12, 2017, now Pat. No. 10,798,508, which is a continuation-in-part of application No. 15/623,339, filed on Jun. 14, 2017, now Pat. No. 10,244,330, which is a continuation-in-part of application No. 15/393,831, filed on Dec. 29, 2016, now Pat. No. 10,171,917.

(51) Int. Cl.
| H04R 19/04 | (2006.01) |
| H04R 19/00 | (2006.01) |
| H02N 2/02 | (2006.01) |
| B81B 3/00 | (2006.01) |
| B81C 1/00 | (2006.01) |

(52) U.S. Cl.
CPC .......... H04R 19/04 (2013.01); B81B 3/0021 (2013.01); B81C 1/00158 (2013.01); H02N 2/02 (2013.01); H04R 19/005 (2013.01); H04R 2201/003 (2013.01); H04R 2410/03 (2013.01)

(58) Field of Classification Search
CPC .................. H04R 19/04; H04R 19/005; H04R 2201/003; H04R 2410/03; B81B 3/0021; B81C 1/00158; H02N 2/02
See application file for complete search history.

(56) References Cited

U.S. PATENT DOCUMENTS

| 4,403,163 | A * | 9/1983 | Armerding | H02K 3/40 310/201 |
| 10,273,150 | B2 * | 4/2019 | Sun | H04R 31/00 |
| 2003/0094047 | A1 * | 5/2003 | Torkkeli | G01L 9/0073 73/716 |
| 2007/0284682 | A1 * | 12/2007 | Laming | H04R 19/005 257/E21.526 |

(Continued)

Primary Examiner — S M Sohel Imtiaz
(74) Attorney, Agent, or Firm — George Guosheng Wang; Upstream Research and Patent LLC (57) ABSTRACT

The present invention provides a capacitive microphone including a MEMS microphone. In the microphone, a movable or deflectable membrane/diaphragm moves in a lateral manner relative to a fixed backplate, instead of moving toward/from the fixed backplate. The fixed backplate includes an electrical insulator sandwiched between two sub-conductors to cancel systematic/background noise. The squeeze film damping is substantially avoided, and the performance, such as signal to noise ratio, of the microphone is significantly improved.

19 Claims, 13 Drawing Sheets

(56) References Cited

U.S. PATENT DOCUMENTS

| | | | |
|---|---|---|---|
| 2008/0226217 A1* | 9/2008 | Kilic | G01H 9/004 385/12 |
| 2008/0247573 A1* | 10/2008 | Pedersen | H04R 19/005 381/174 |
| 2012/0213400 A1* | 8/2012 | Kasai | H04R 19/04 381/369 |
| 2014/0264662 A1* | 9/2014 | Cheng | B81B 7/02 257/419 |
| 2015/0274506 A1* | 10/2015 | Feyh | B81C 1/00301 257/416 |
| 2016/0037266 A1* | 2/2016 | Uchida | H04R 7/06 381/174 |
| 2016/0130137 A1* | 5/2016 | Huang | B81B 7/02 438/51 |
| 2016/0167946 A1* | 6/2016 | Jenkins | H04R 19/005 257/416 |
| 2017/0166437 A1* | 6/2017 | Klein | H04R 19/005 |
| 2017/0265009 A1* | 9/2017 | Sridharan | H04R 7/26 |
| 2018/0086624 A1* | 3/2018 | Cheng | B81B 3/007 |
| 2018/0359571 A1* | 12/2018 | Zhan | B81C 1/00158 |

\* cited by examiner (Prior Art)

LATERAL MODE CAPACITIVE MICROPHONE INCLUDING A CAPACITOR PLATE WITH SANDWICH STRUCTURE FOR ULTRA HIGH PERFORMANCE

CROSS-REFERENCE TO RELATED U.S. APPLICATIONS

This application is a Continuation-in-Part of U.S. non-provisional application Ser. No. 15/730,732 filed on Oct. 12, 2017, which is a Continuation-in-Part of U.S. non-provisional application Ser. No. 15/623,339 filed on Jun. 14, 2017 (granted as U.S. Pat. No. 10,244,330 on Mar. 26, 2019), which is a Continuation-in-Part of U.S. non-provisional application Ser. No. 15/393,831 filed on Dec. 29, 2016 (granted as U.S. Pat. No. 10,171,917 on Jan. 1, 2019), all of which are incorporated herein by reference in their entirety.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to a MEMS device, such as a lateral mode capacitive microphone that includes a capacitor plate with a sandwich structure for total performance improvement. The microphone of the invention may find applications in smart phones, telephones, hearing aids, public address systems for concert halls and public events, motion picture production, live and recorded audio engineering, two-way radios, megaphones, radio and television broadcasting, and in computers for recording voice, speech recognition, VoIP, and for non-acoustic purposes such as ultrasonic sensors or knock sensors, among others.

BACKGROUND OF THE INVENTION

A microelectromechanical system (MEMS) is a microscopic device with moving parts that is fabricated in the same general manner as integrated circuits. For example, a MEMS microphone is a transducer that converts sound into an electrical signal. Among different designs of microphone, a capacitive microphone or a condenser microphone is conventionally constructed employing the so-called "parallel-plate" capacitive design. Unlike other microphone types that require the sound wave to do more work, only a very small mass in capacitive microphones needs be moved by the incident sound wave. Capacitive microphones generally produce a high-quality audio signal and are now the popular choice in consumer electronics, laboratory and recording studio applications, ranging from telephone transmitters through inexpensive karaoke microphones to high-fidelity recording microphones.

Figure 1:
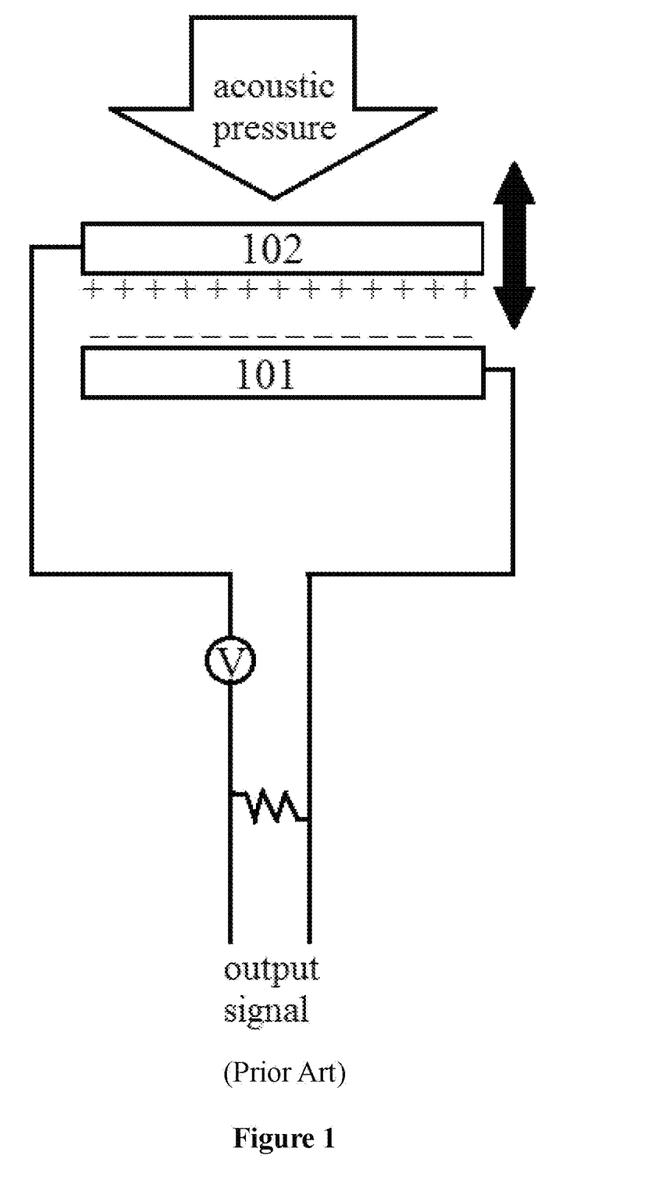
FIG. 1 shows a conventional capacitive microphone in the prior art.

FIG. 1 is a schematic diagram of parallel capacitive microphone in the prior art. Two thin layers 101 and 102 are placed closely in almost parallel. One of them is fixed backplate 101, and the other one is movable/deflectable membrane/diaphragm 102, which can be moved or driven by sound pressure. Diaphragm 102 acts as one plate of a capacitor, the vibrations of which produce changes in the distance between two layers 101 and 102, and changes in the mutual capacitance therebetween.

"Squeeze film" and "squeezed film" refer to a type of hydraulic or pneumatic damper for damping vibratory motion of a moving component with respect to a fixed component. Squeezed film damping occurs when the moving component is moving perpendicular and in close proximity to the surface of the fixed component (e.g., between approximately 2 and 50 micrometers). The squeezed film effect results from compressing and expanding the fluid (e.g., a gas or liquid) trapped in the space between the moving plate and the solid surface. The fluid has a high resistance, and damps the motion of the moving component as the fluid flows through the space between the moving plate and the solid surface.

In capacitive microphones as shown in FIG. 1, squeeze film damping occurs when two layers 101 and 102 are in close proximity to each other with air disposed between them. The layers 101 and 102 are positioned so close together (e.g. within 5 m) that air can be "squeezed" and "stretched" to slow movement of membrane/diaphragm 101. As the gap between layers 101 and 102 shrinks, air must flow out of that region. The flow viscosity of air, therefore, gives rise to a force that resists the motion of moving membrane/diaphragm 101. Squeeze film damping is significant when membrane/diaphragm 101 has a large surface area to gap length ratio. Such squeeze film damping between the two layers 101 and 102 becomes a mechanical noise source, which is the dominating factor among all noise sources in the entire microphone structure.

Advantageously, the present invention provides a microphone design in which the squeeze film damping is substantially avoided because the movable membrane/diaphragm does not move into the fixed backplate. Moreover, a capacitor plate with a sandwich structure according to the invention can effectively reduce or cancel systemic or background noise in the microphone.

SUMMARY OF THE INVENTION

The present invention provides a capacitive microphone comprising a first electrical conductor and a second electrical conductor. The two conductors are configured to have a relative spatial relationship therebetween so that a mutual capacitance can be generated between them. The relative spatial relationship as well as the mutual capacitance can both be varied by an acoustic pressure impacting upon the first electrical conductor and/or the second electrical conductor along a range of impacting directions in 3D space. Given the same strength/intensity of acoustic pressure, the mutual capacitance can be varied the most (or maximally varied) by an acoustic pressure impacting upon the first electrical conductor and/or the second electrical conductor along one direction among the above range of impacting directions. Such a direction is defined as the primary direction. The first electrical conductor has a first projection along the primary direction on a conceptual plane that is perpendicular to the primary direction. The second electrical conductor has a second projection along the primary direction on the conceptual plane. The first projection and the second projection have a shortest distance Dmin therebetween, and Dmin remains greater than zero regardless the first electrical conductor and/or the second electrical conductor is (are) impacted by an acoustic pressure along the primary direction or not.

In various exemplary embodiments of the invention, one of the above two electrical conductors (preferably the first electrical conductor) includes an electrical insulator sandwiched between two sub-conductors. The above mutual capacitance consists of (or is the sum of) two sub-capacitances that generated between another one of the two electrical conductors (preferably the second electrical conductor) and the two sub-conductors respectively. In preferred embodiments, the two sub-capacitances are approximately equal in the absence of an acoustic pressure impacting upon the above two electrical conductors. In other preferred embodiments, the electrical insulator and the two sub-conductors are stacked over each other along the primary direction (e.g. a three-layer "sandwich" structure).

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

Figure 2A:
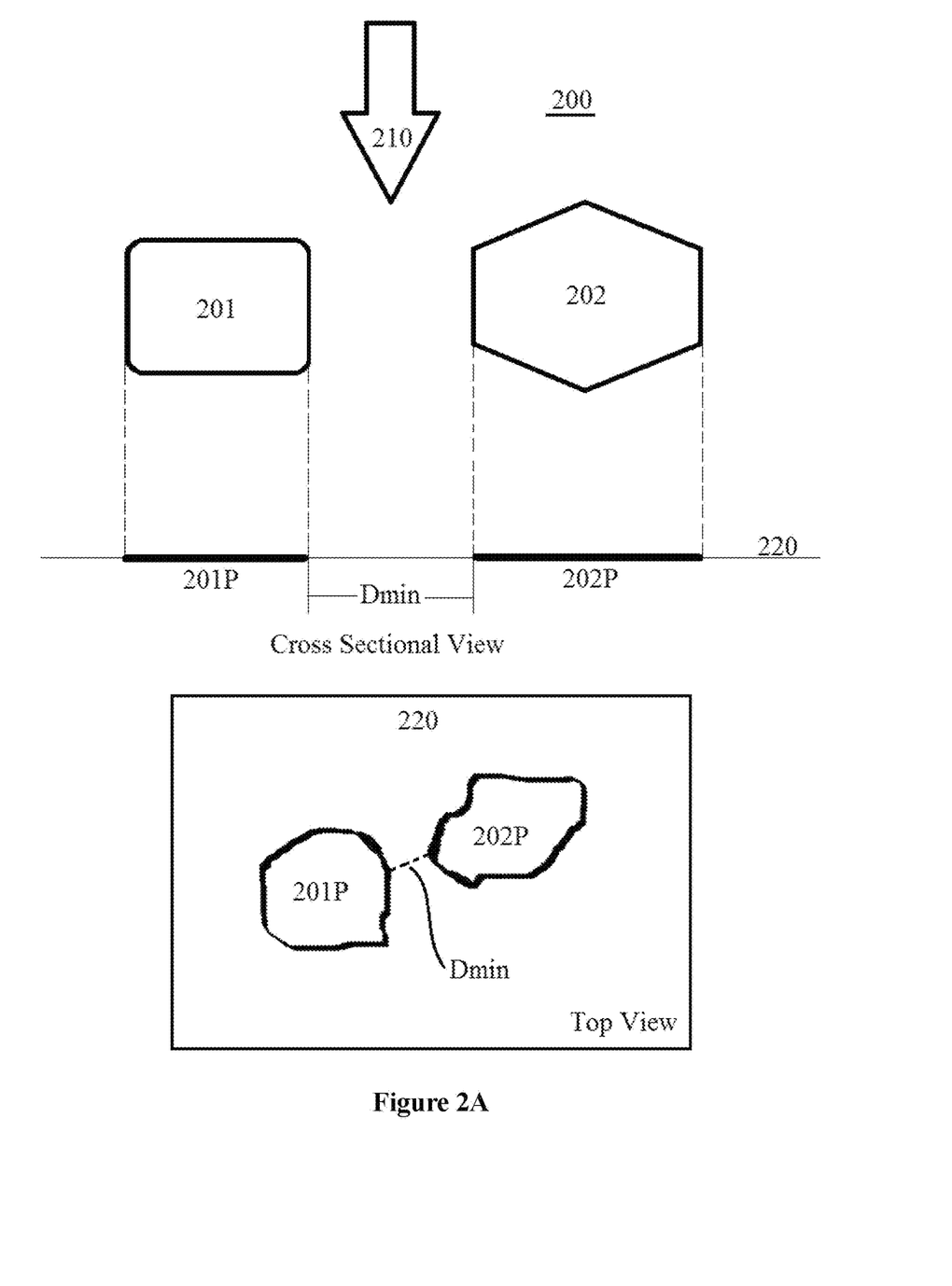
FIG. 2A schematically shows a lateral mode capacitive microphone in accordance with an exemplary embodiment of the present invention.
Figure 3:
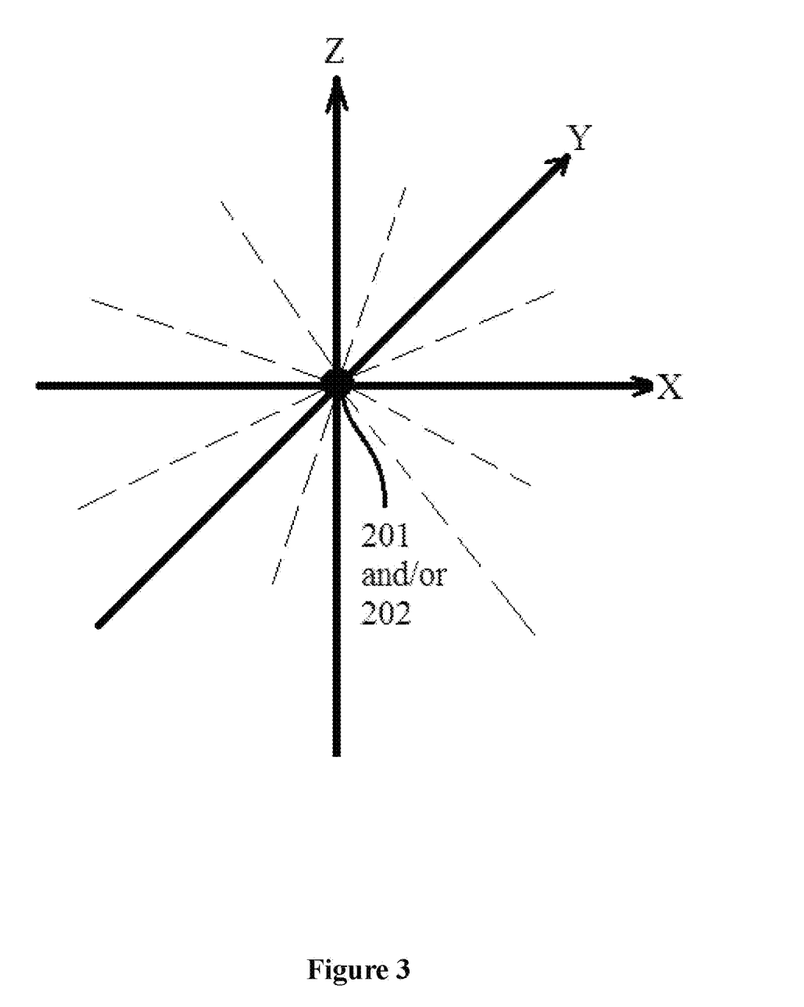
FIG. 3 illustrates acoustic pressures impacting a microphone along a range of directions.
Figure 4:
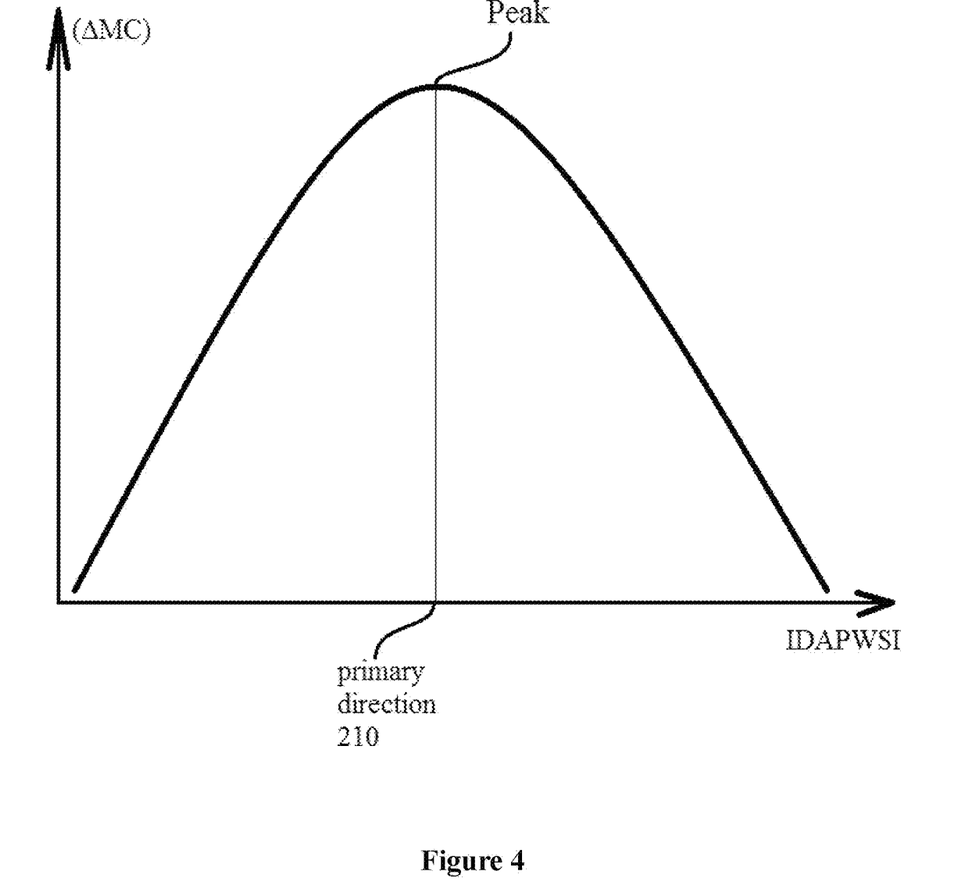
FIG. 4 illustrates the methodology on how to determine the primary direction for the internal components in a microphone in accordance with an exemplary embodiment of the present invention.

FIG. 2A illustrates a capacitive microphone 200 such as a MEMS microphone according to various embodiments of the invention. A first electrical conductor 201 and a second electrical conductor 202 are configured to have a relative spatial relationship therebetween so that a mutual capacitance can be generated between them. The first electrical conductor 201 and the second electrical conductor 202 are independently of each other made of polysilicon, gold, silver, nickel, aluminum, copper, chromium, titanium, tungsten, and platinum. The relative spatial relationship as well as the mutual capacitance can both be varied by an acoustic pressure impacting upon the first electrical conductor 201 and/or the second electrical conductor 202. As shown in FIG. 3, the acoustic pressure may impact conductor 201 and/or 202 along a range of impacting directions in 3D space as represented by dotted lines. Given the same strength/intensity of acoustic pressure, the mutual capacitance can be varied the most (or maximally varied) by an acoustic pressure impacting upon the first electrical conductor 201 and/or the second electrical conductor 202 along a certain direction among the above range of impacting directions as shown in FIG. 3. The variation of mutual capacitance (AMC) caused by various impacting directions of acoustic pressure from 3D space with same intensity (IDAPWSI) is conceptually plotted in FIG. 4. A primary direction is defined as the impacting direction that generates the peak value of AMC, and is labeled as direction 210 in FIG. 2A. It should be appreciated that, given the same strength/intensity of acoustic pressure, the relative spatial relationship can be varied the most (or maximally varied) by an acoustic pressure impacting upon the first electrical conductor 201 and/or the second electrical conductor 202 along a certain direction X among the range of impacting directions as shown in FIG. 3. Direction X may be the same as, or different from, the primary direction 210 as defined above. In some embodiments of the invention, the primary direction may be alternatively defined as the direction X.

Referring back to FIG. 2A, the first electrical conductor 201 has a first projection 201P along the primary direction 210 on a conceptual plane 220 that is perpendicular to the primary direction 210. The second electrical conductor 202 has a second projection 202P along the primary direction 210 on the conceptual plan 220e. The first projection 201P and the second projection 202P have a shortest distance Dmin therebetween. In the present invention, Dmin may be constant or variable, but it is always greater than zero, no matter the first electrical conductor 201 and/or the second electrical conductor 202 is (are) impacted by an acoustic pressure along the primary direction 210 or not.

Figure 2B:
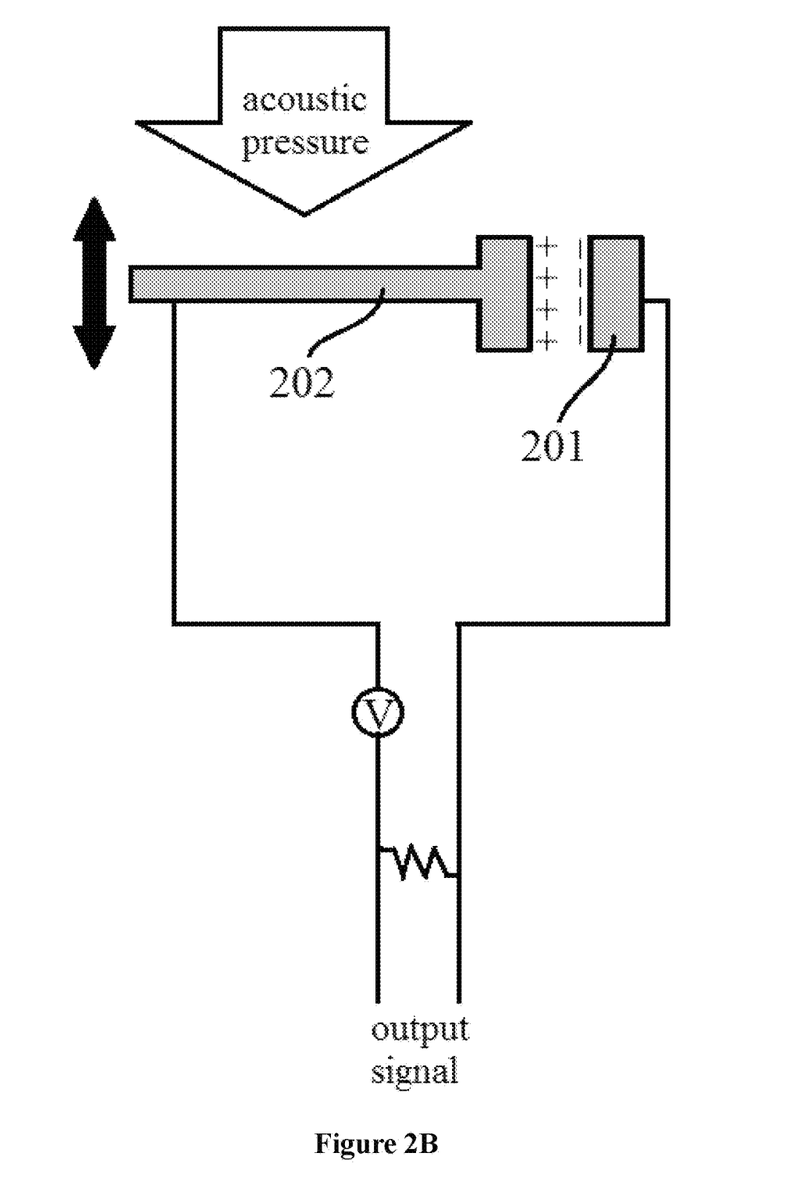
FIG. 2B illustrates a lateral mode capacitive microphone in accordance with an exemplary embodiment of the present invention.

FIG. 2B illustrates an exemplary embodiment of the microphone of FIG. 2A. First electrical conductor 201 is stationary, and has a function similar to the fixed backplate in the prior art. A large flat area of second electrical conductor 202, similar to movable/deflectable membrane/diaphragm 102 in FIG. 1, receives acoustic pressure and moves up and down along the primary direction, which is perpendicular to the flat area. However, conductors 201 and 202 are configured in a side-by-side spatial relationship relative to the primary direction 210 (rather than a stacked "one-above-another" configuration along the primary direction 210). As one "plate" of the capacitor, second electrical conductor 202 does not move toward and from first conductor 201. Instead, second conductor 202 laterally moves over, or "glides" over, first conductor 201, producing changes in the overlapped area between 201 and 202, and therefore varying the mutual capacitance therebetween. A capacitive microphone based on such a relative movement between conductors 201 and 202 is called lateral mode capacitive microphone in the present invention.

Figure 2C:
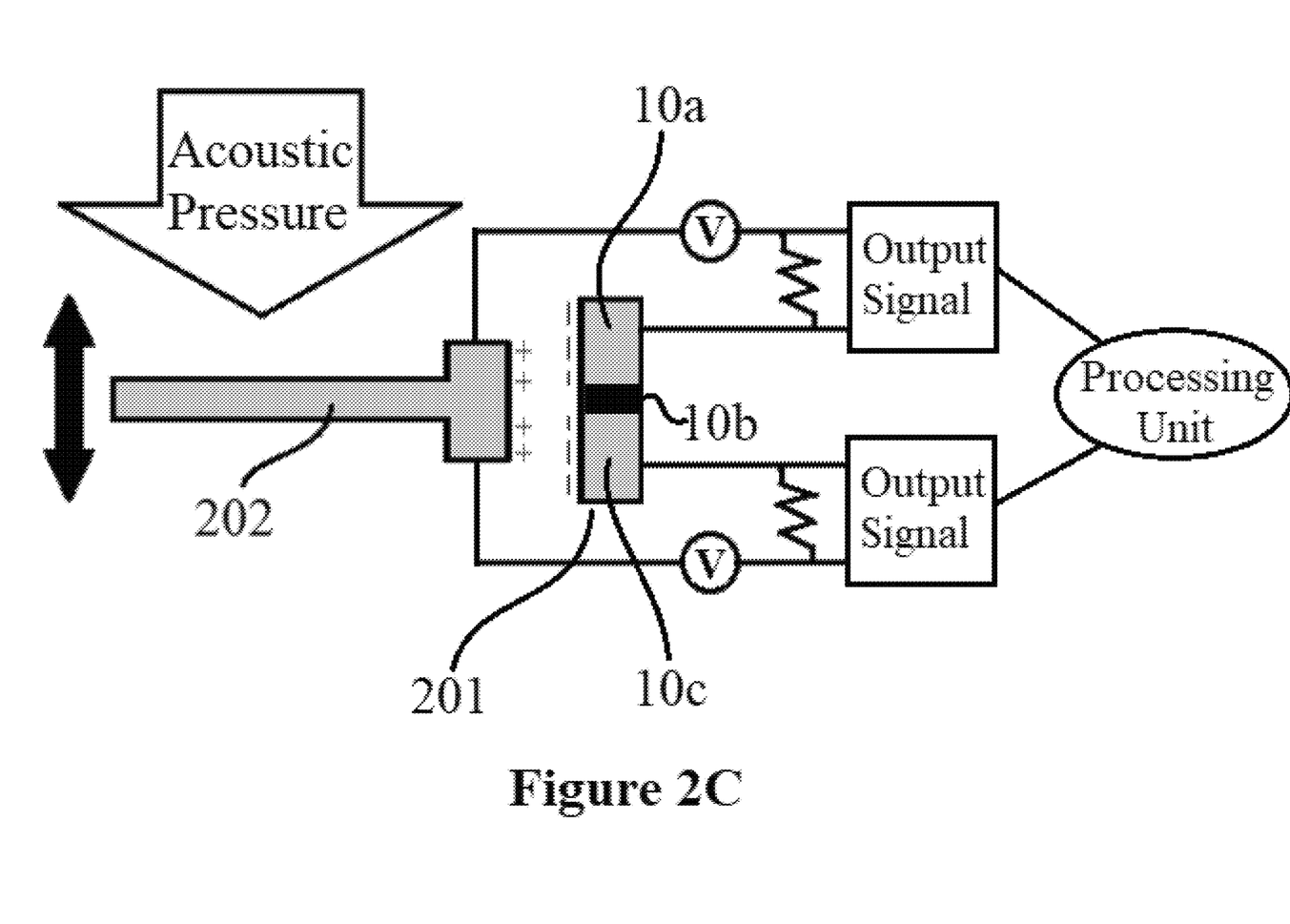
FIG. 2C illustrates a lateral mode capacitive microphone that includes a capacitor plate with a sandwich structure in accordance with an exemplary embodiment of the present invention.

FIG. 2C illustrates an exemplary embodiment of the microphone of FIG. 2B. Anyone of the two electrical conductors 201 and 202, preferably the first electrical conductor 201, includes an electrical insulator 10b (e.g. made of silicon nitride) sandwiched between two sub-conductors 10a and 10c. Another one of the two electrical conductors 201 and 202, preferably the second electrical conductor 202, does not include such an electrical insulator 10b, let alone sandwiched between two sub-conductors. Now, the mutual capacitance (MC) between electrical conductors 201 and 202 consists of (or is the sum of) two sub-capacitances MC1 and MC2. MC1 is generated between second electrical conductor 202 and sub-conductor 10a. MC2 is generated between second electrical conductor 202 and sub-conductor 10c. MC=MC1+MC2. In preferred embodiments, the two sub-capacitances MC1 and MC2 are approximately equal in the absence of an acoustic pressure impacting upon the two electrical conductors 201 and 202. For example, MC1=45-55% MC, MC2=55-45% MC, and MC=MC1+MC2. In other preferred embodiments, the electrical insulator 10b and the two sub-conductors (10a and 10c) are stacked over each other along the primary direction 210 (e.g. a three-layer "sandwich" structure). In more preferred embodiments, the overlapped area (OA1) between conductor 202 and sub-conductors 10a is approximately the same as that between conductor 202 and sub-conductors 10c (OA2) in the absence of an acoustic pressure impacting upon the two electrical conductors 201 and 202. For example, OA1 may be in a range of from 0.9×OA2 to 1.1×OA2. In even more preferred embodiments, the height (as measured along the primary direction 210) of the overlapped area between conductor 202 and sub-conductors 10a (OH1) is approximately the same as that between conductor 202 and sub-conductors 10c (OH2) in the absence of an acoustic pressure impacting upon the above two electrical conductors 201 and 202. For example, OH1 may be between 0.9×OH2 and 1.1×OH2. When the MEMS device is in operation, the difference between the value of the changes of MC1 and the value of the changes of MC2, i.e. $\Delta MC1$-$\Delta MC2$ may be provided as the output signal, which will result in an amplitude of signal approximately sum of the amplitude of signal $\Delta MC1$ and the amplitude of signal $\Delta MC2$ because $\Delta MC1$ and $\Delta MC2$ have opposite signal phases when driven by acoustic waves, and which will help reduce systematical noises that come from several sources such as radio-frequency interference (RFI).

In exemplary embodiments of the invention, the microphone may be a MEMS (Microelectromechanical System) microphone, AKA chip/silicon microphone. Typically, a pressure-sensitive diaphragm is etched directly into a silicon wafer by MEMS processing techniques, and is usually accompanied with integrated preamplifier. For a digital MEMS microphone, it may include built-in analog-to-digital converter (ADC) circuits on the same CMOS chip making the chip a digital microphone and so more readily integrated with digital products.

Figure 5:
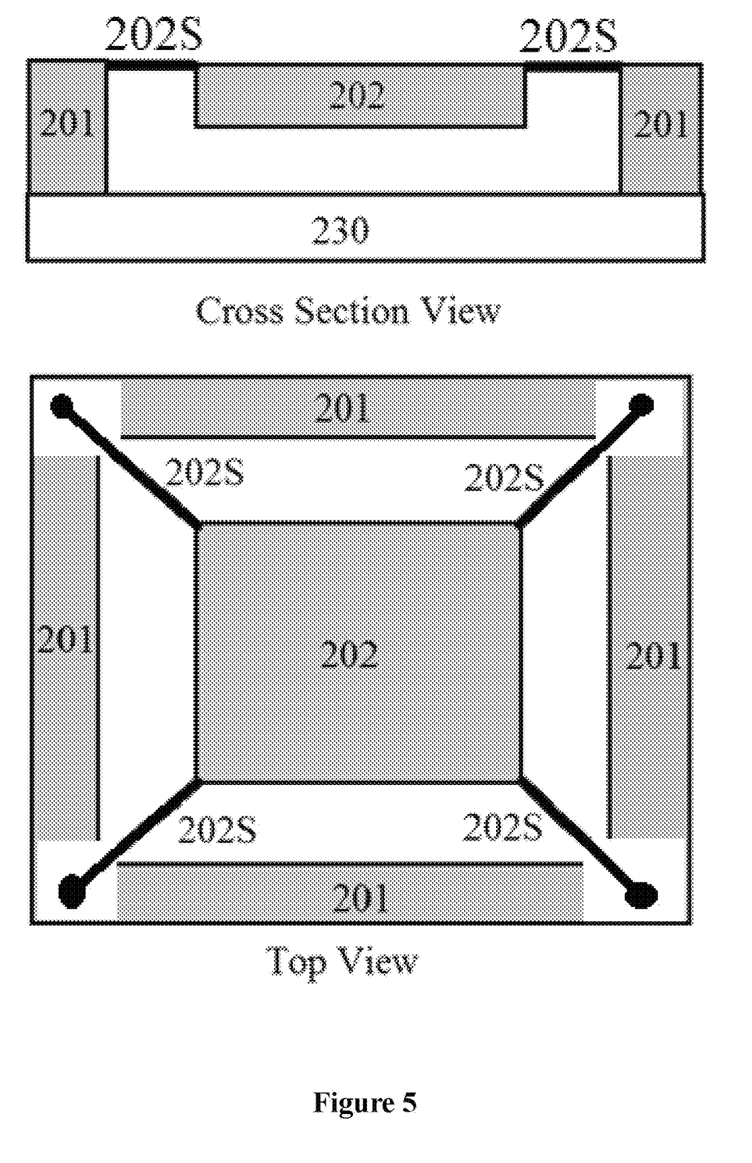
FIG. 5 schematically shows a MEMS capacitive microphone in accordance with an exemplary embodiment of the present invention.

In an embodiment as shown in FIG. 5, capacitive microphone 200 may include a substrate 230 such as silicon. The substrate 230 can be viewed as the conceptual plane 220 in FIG. 2A. The first electrical conductor 201 and the second electrical conductor 202 may be constructed above the substrate 230 side-by-side. Alternatively, first electrical conductor 201 may surround the second electrical conductor 202, as shown in FIG. 5. In an exemplary embodiment, first electrical conductor 201 is fixed relative to the substrate 230. On the other hand, second electrical conductor 202 may contain a membrane that is movable up-and-down relative to the substrate 230. The primary direction may be (is) perpendicular to the membrane plane 202. The movable membrane 202 may be attached to the substrate 230 via three or more suspensions 202S such as four suspensions 202S. As will be described and illustrated later, each of the suspension 202S may comprise folded and symmetrical cantilevers.

Figure 6:
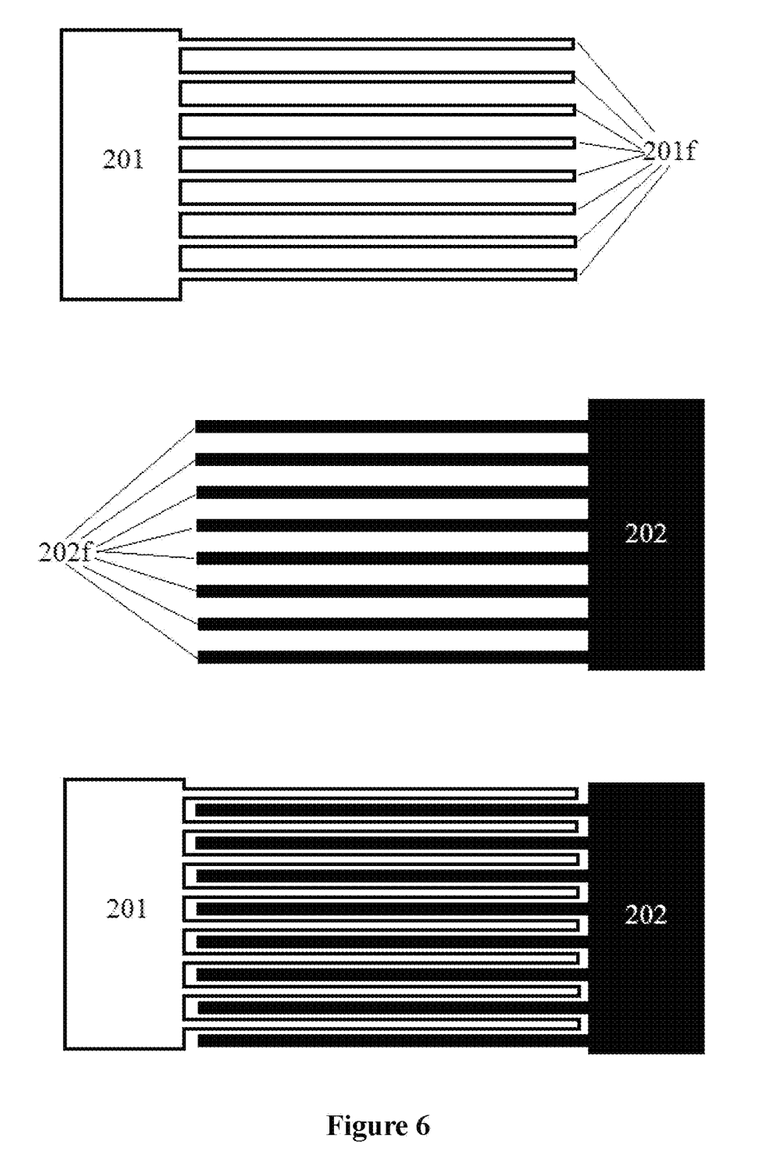
FIG. 6 illustrates the first/second electrical conductors having a comb finger configuration in accordance with an exemplary embodiment of the present invention.

In an embodiment as shown in FIG. 6, the first electrical conductor 201 comprises a first set of comb fingers 201f. The movable membrane as second conductor 202 comprises a second set of comb fingers 202f around the peripheral region of the membrane. The two sets of comb fingers 201f and 202f are interleaved into each other. The second set of comb fingers 202f is movable along the primary direction, which is perpendicular to the membrane plane 202, relative to the first set of comb fingers 201f. As such, the resistance from air located within the gap between the membrane 202 and the substrate is lowered; for example, 25 times lower squeeze film damping.

Figure 7:
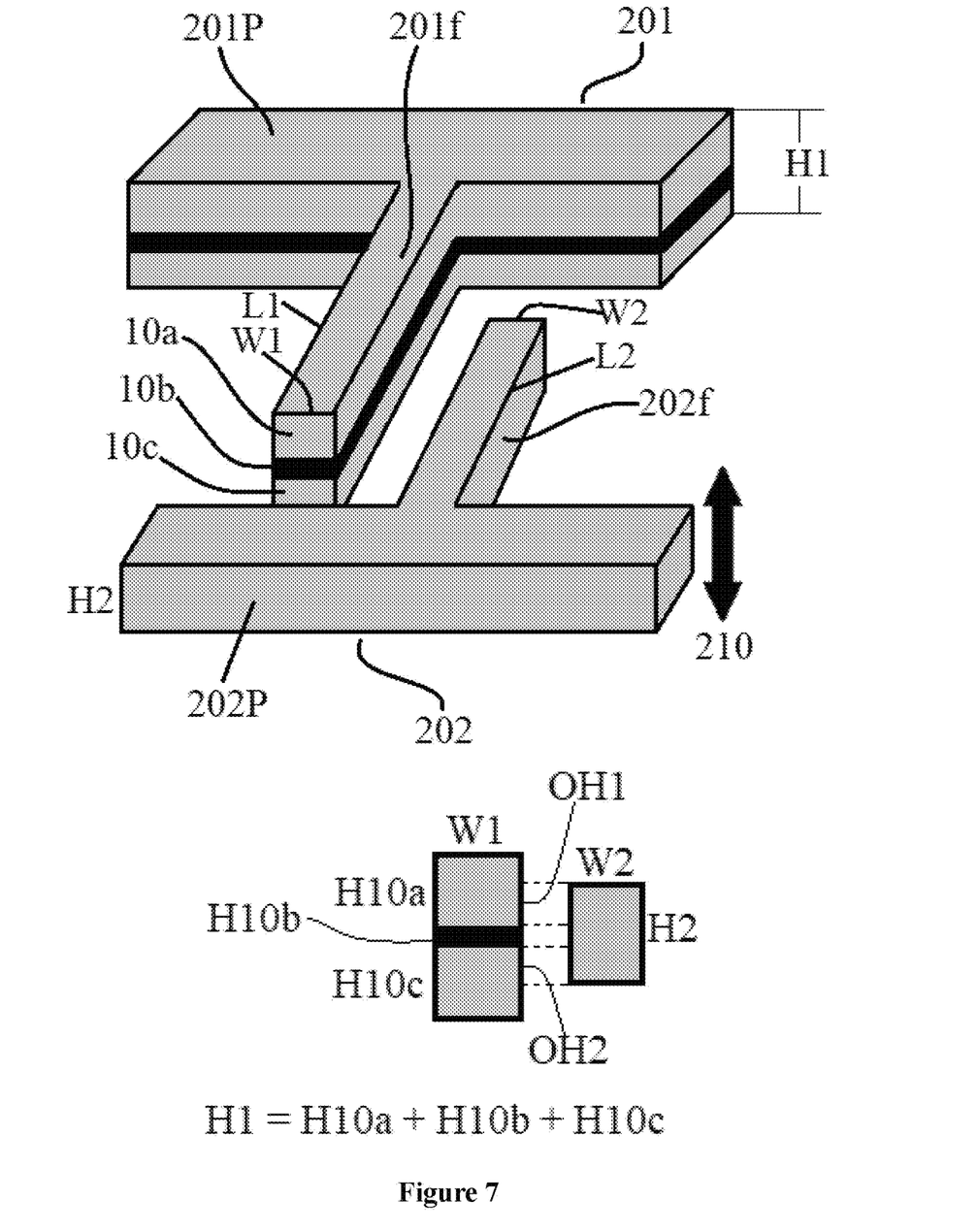
FIG. 7 depicts a specific spatial relationship between the two comb fingers of FIG. 6 in accordance with an exemplary embodiment of the present invention.

In various embodiments, the first set of comb fingers 201f and the second set of comb fingers 202f are so configured that an entire height of the second set of comb fingers 202f overlaps a continuous height including an entire height of said electrical insulator 10b, a bottom one third of an entire height of the sub-conductor 10a above the electrical insulator 10b, and a top one third of an entire height of the sub-conductor 10c below the electrical insulator 10c. Please note all the heights herein are measured along the primary direction 210. In a preferred embodiment as shown in FIG. 7, each comb finger in the first set of comb fingers 201f and the second set of comb fingers 202f may have a long and thin rectangular shape. Each comb finger 201f has a width W1, a length L1 as measured from the comb palm 201P, and a height H1 as measured along the primary direction 210. Likewise, each comb finger 202f has a width W2, a length L2 as measured from the comb palm 202P, and a height H2 as measured along the primary direction 210. Two sub-conductors (10a, 10c) and electrical insulator 10b have heights H10a, H10c and H10b respectively, as measured along the primary direction 210. H1=H10a+H10c+H10b.

The height OH1 (as measured along the primary direction 210) of the overlapped area between finger 202f and sub-conductors 10a is approximately the same as that between finger 202f and sub-conductors 10c (OH2) in the absence of an acoustic pressure impacting upon the two electrical conductors (or combs) 201 and 202. For example, OH1 may be between 0.9×OH2 and 1.1×OH2. In a specific embodiment, W1≈W2, L1≈L2, H1>H2, H10a≈H10c, OH1×OH2, OH1≈⅓×H10a, and OH2≈⅓×H10c. The symbol "x" may be equivalent to "=" with a 5% deviation.

Figure 8:
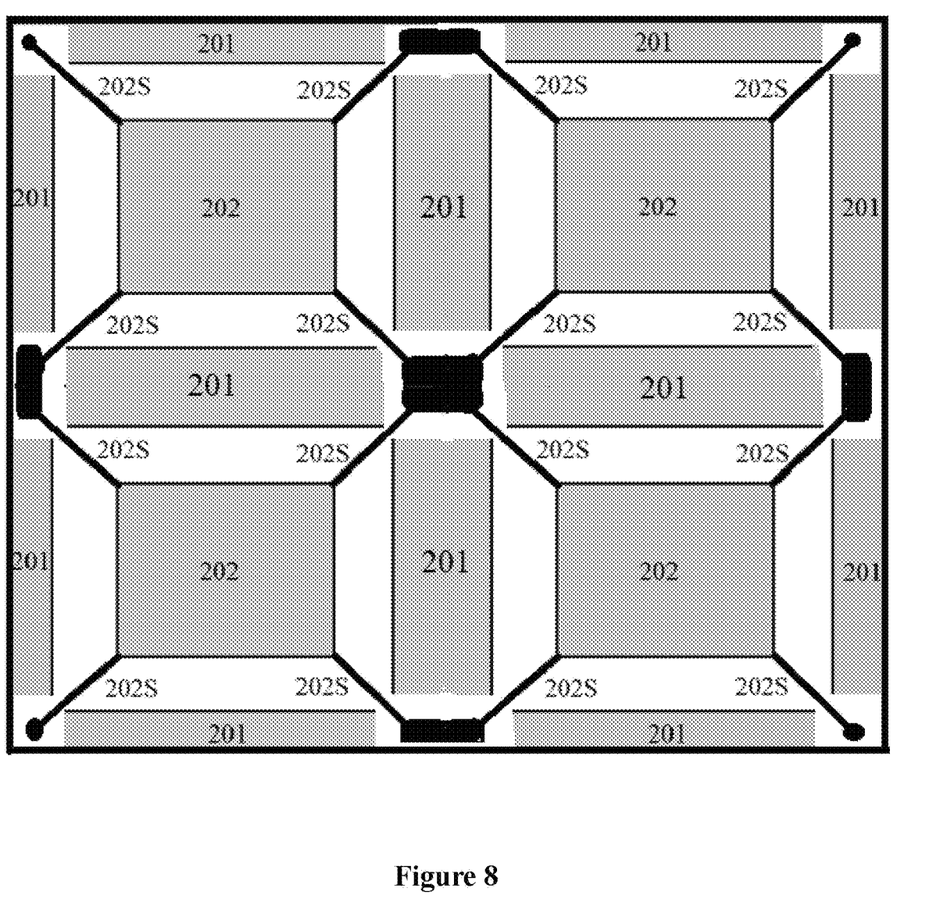
FIG. 8 shows that four movable membranes are arranged in a 2×2 array configuration in accordance with an exemplary embodiment of the present invention.

In exemplary embodiments, the movable membrane 202 may have a shape of square in a top view. As shown in the top view of FIG. 8, the capacitive microphone of the invention may include one or more movable membranes. For example, four movable membranes can be arranged in a 2×2 array configuration.

Figure 9:
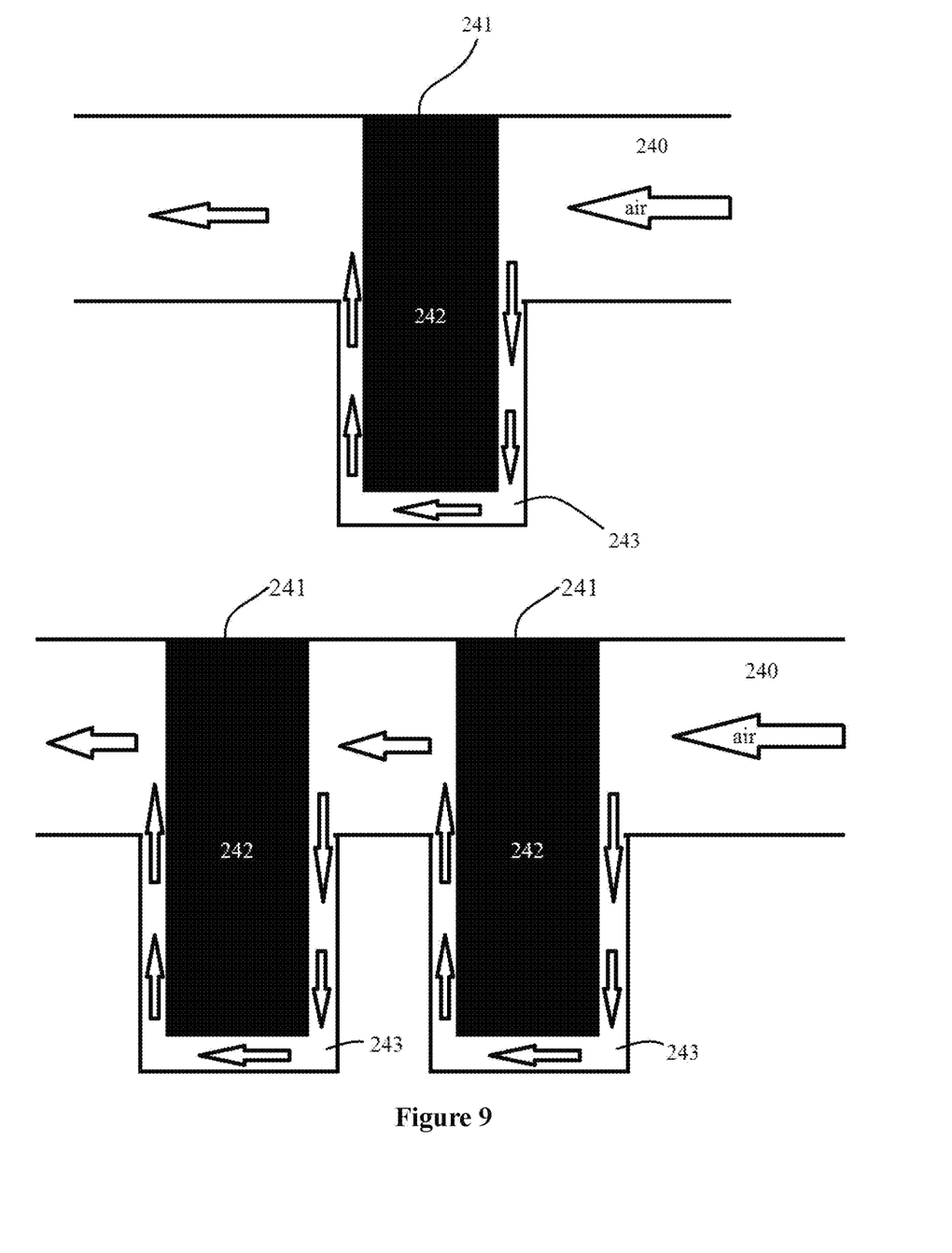
FIG. 9 demonstrates the design of one or more such as two air flow restrictors in accordance with an exemplary embodiment of the present invention.

In some embodiments as shown in FIG. 9, the capacitive microphone of the invention comprises one or more such as two air flow restrictors 241 that restrict the flow rate of air that flows in/out of the gap between the membrane 202 and the substrate 230. Air flow restrictors 241 may be designed to decrease the size of an air channel 240 for the air to flow in/out of the gap. Alternatively or additionally, air flow restrictors 241 may increase the length of the air channel 240 for the air to flow in/out of the gap. For example, air flow restrictors 241 may comprise an insert 242 into a groove 243, which not only decreases the size of an air channel 240, but also increases the length of the air channel 240.

Referring back to FIGS. 6 and 7, comb fingers 201f are fixed relative to the substrate 230, and comb fingers 202f are integrated with membrane-shaped second electrical conductor 202 (hereinafter membrane 202 for simplicity). When membrane 202 vibrates due to sound wave, fingers 202f move together with membrane 202. The overlap areas (OA1 and OA2) between two neighboring fingers 201f and 202f change along with this movement, so do the capacitance therebetween. Eventually, two capacitance change signals (ΔMC1 and ΔMC2) are detected and are processed to provide the final output, the same as conventional capacitive microphone.

Figure 10:
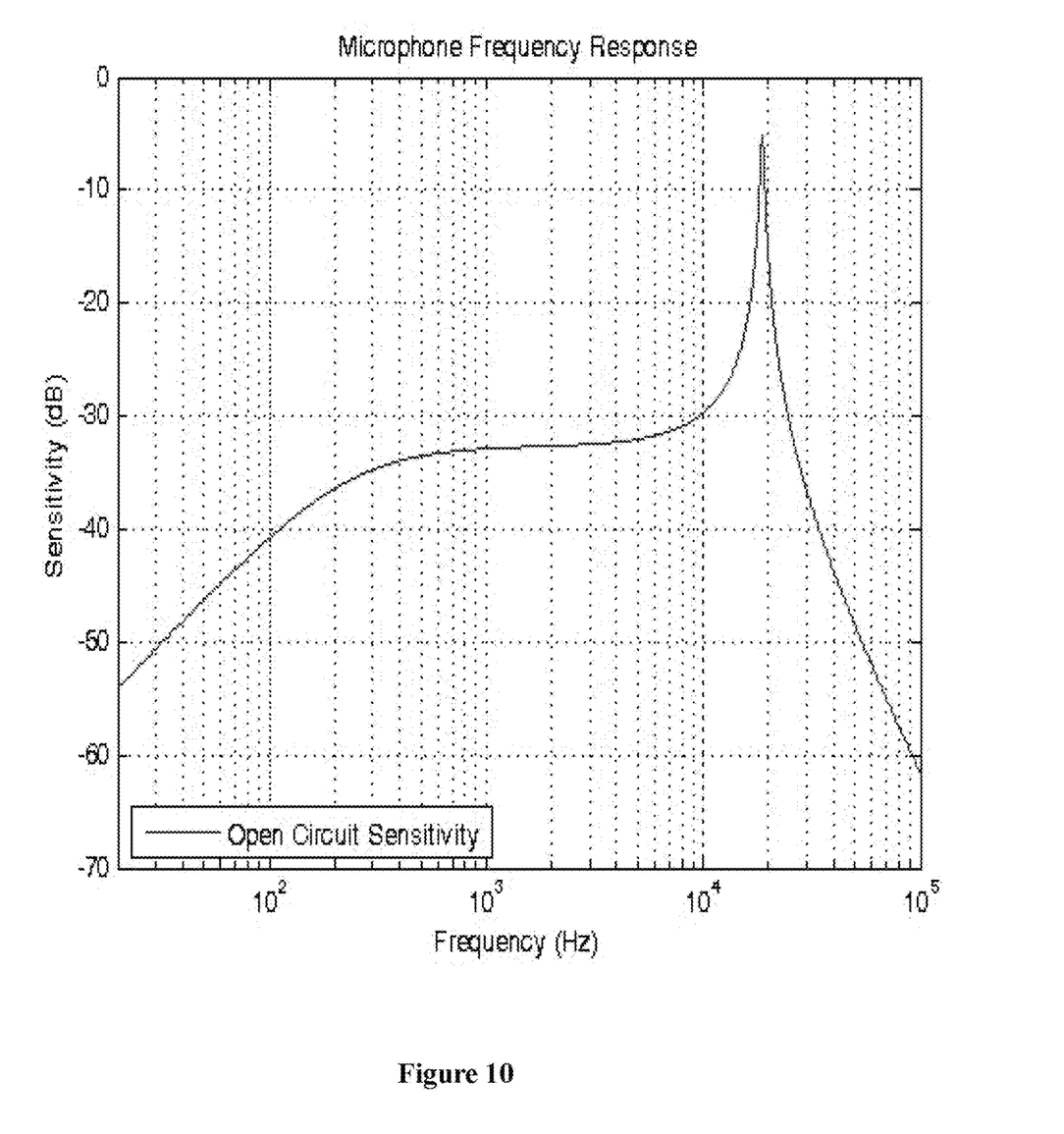
FIG. 10 shows that microphone sensitivity drops at low frequency due to air leakage.

Leakage is always a critical issue in microphone design. In conventional parallel plate design as shown in FIG. 1, it typically has a couple of tiny holes around the edge in order to let air go through slowly, to keep air pressure balance on both sides of membrane 101 in low frequency. That is a desired leakage. However, a large leakage is undesired, because it will let some low frequency sound wave escape away from membrane vibration easily via the holes, and will result in a sensitivity drop in low frequency. FIG. 10 shows that sensitivity drops at low frequency due to leakage. For a typical capacitive MEMS microphone, the frequency range is between 100 Hz and 20 kHz, thus the sensitivity drop in FIG. 10 is undesired.

Figure 11:
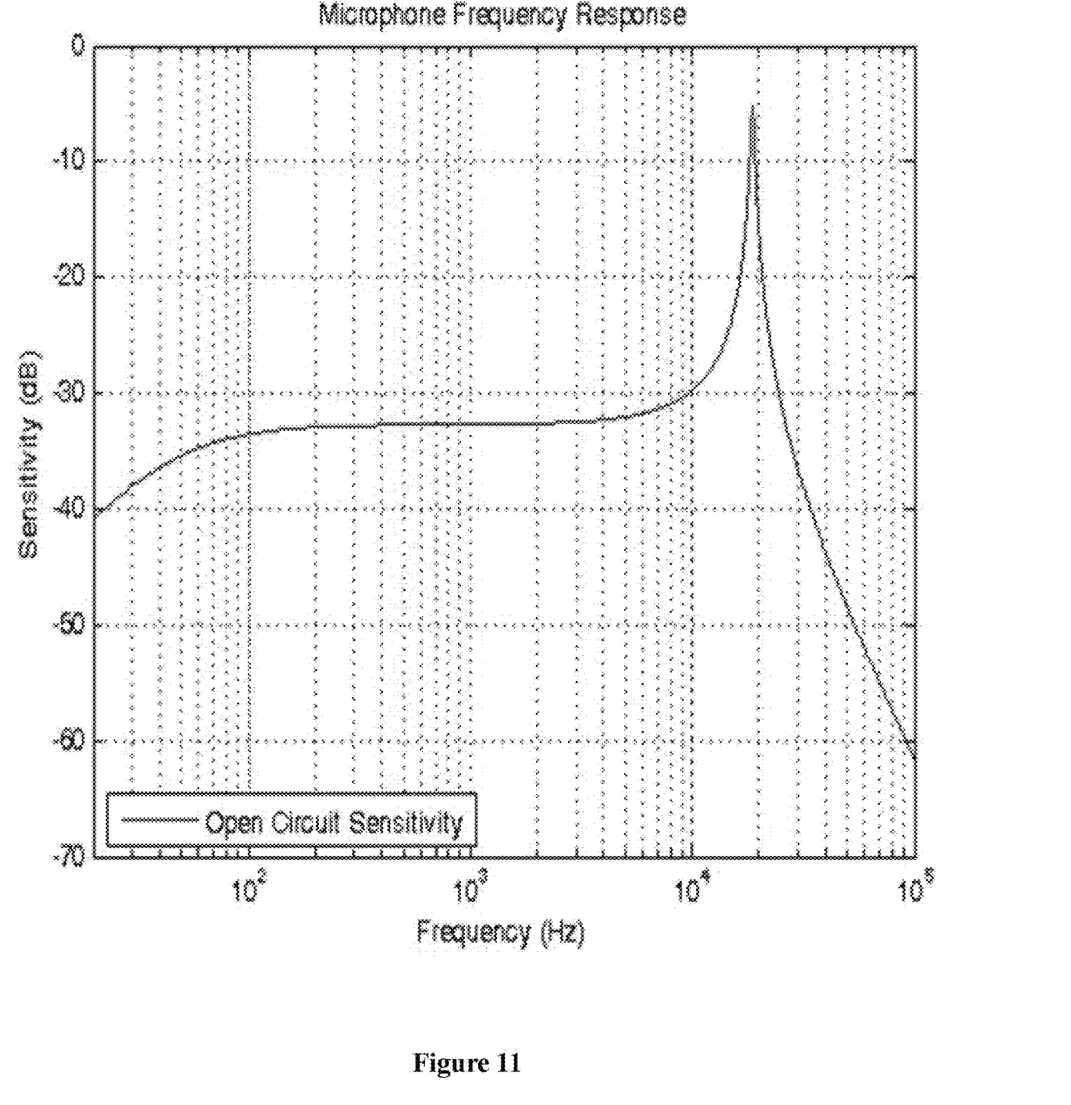
FIG. 11 shows the frequency response with air leakage reduced/prevented in accordance with an exemplary embodiment of the present invention.

In order to prevent this large leakage, a more preferred structure is designed and shown in FIG. 9, which illustrates a leakage prevent groove or slot and wall. Referring back to FIG. 9, air flow restrictors 241 may function as a structure for preventing air leakage in the microphone of the invention. Air flow restrictor 241 comprises an insert 242 into a groove 243, which not only decreases the size of an air channel 240, but also increases the length of the air channel 240. In MEMS microphones, a deep slot may be etched on substrate around the edge of square membrane 202 and then a wall 242 connected to membrane 202 is deposited to form a long and narrow air tube 240, which gives a large acoustic resistance. FIG. 11 depicts the frequency response with leakage prevented. This leakage prevention structure has a significant effect on keeping the frequency response plot more flat on the range 100 Hz to 1000 Hz. The level of the air resistance may be controlled by the slot depth etched on the substrate. The deeper slot, the higher the resistance.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A capacitive microphone comprising a first electrical conductor and a second electrical conductor configured to have a relative spatial relationship therebetween,
    wherein a mutual capacitance (MC) can be generated between the first electrical conductor and the second electrical conductor;
    wherein said relative spatial relationship and said mutual capacitance can both be varied by an acoustic pressure impacting upon the first electrical conductor and/or the second electrical conductor along a range of impacting directions in 3D space;
    wherein said mutual capacitance is varied the most by an acoustic pressure impacting upon the first electrical conductor and/or the second electrical conductor along one direction among said range of impacting directions, said one direction being defined as the primary direction;
        wherein the first electrical conductor has a first projection along said primary direction on a conceptual plane that is perpendicular to said primary direction;
    wherein the second electrical conductor has a second projection along said primary direction on the conceptual plane;
    wherein the first projection and the second projection have a shortest distance Dmin therebetween, and Dmin remains greater than zero regardless of that the first electrical conductor and/or the second electrical conductor is (are) impacted by an acoustic pressure along said primary direction or not;
    wherein one of the two electrical conductors includes an electrical insulator sandwiched between two sub-conductors; and said mutual capacitance consists of two sub-capacitances generated between another one of the two electrical conductors and the two sub-conductors, and
    wherein the electrical insulator and the two sub-conductors are stacked over each other along the primary direction, forming a three-layer "sandwich" structure.

2. The capacitive microphone according to claim 1, wherein the two sub-capacitances are MC1 and MC2; MC=MC1+MC2; MC1=45-55% MC; and MC2=55-45% MC, in the absence of an acoustic pressure impacting upon the two electrical conductors.

3. The capacitive microphone according to claim 1, wherein said electrical insulator is made of silicon nitride; and wherein said another one of the two electrical conductors and the two sub-conductors are independently of each other made of polysilicon, gold, silver, nickel, aluminum, copper, chromium, titanium, tungsten, or platinum.

4. The capacitive microphone according to claim 1, which is a microelectromechanical system (MEMS) microphone.

5. The capacitive microphone according to claim 1, further comprising a substrate, wherein the substrate can be viewed as said conceptual plane, and wherein the first electrical conductor and the second electrical conductor are constructed above the substrate side-by-side.

6. The capacitive microphone according to claim 5, wherein the first electrical conductor is fixed relative to the substrate; wherein the first electrical conductor includes said electrical insulator sandwiched between said two sub-conductors; wherein the second electrical conductor comprises a membrane that is movable relative to the substrate; and wherein said primary direction is perpendicular to the membrane plane.

7. The capacitive microphone according to claim 6, wherein the movable membrane is attached to the substrate via three or more suspensions.

8. The capacitive microphone according to claim 7, wherein the suspension comprises folded and symmetrical cantilevers.

9. The capacitive microphone according to claim 6, wherein the first electrical conductor comprises a first set of comb fingers, wherein the movable membrane comprises a second set of comb fingers around the peripheral region of the membrane, and wherein the two sets of comb fingers are interleaved into each other.

10. The capacitive microphone according to claim 9, wherein the second set of comb fingers are laterally movable relative to the first set of comb fingers, and the resistance from air located within the gap between the membrane and the substrate is lowered.

11. The capacitive microphone according to claim 9, wherein the first set of comb fingers and the second set of comb fingers are so configured that an entire height of the second set of comb fingers overlaps a continuous height including an entire height of said electrical insulator, a bottom one third of an entire height of the sub-conductor above the electrical insulator, and a top one third of an entire height of the sub-conductor below the electrical insulator; wherein all the heights are measured along the primary direction.

12. The capacitive microphone according to claim 6, wherein the movable membrane is square shaped in a top view.

13. The capacitive microphone according to claim 12, which comprises one or more of said movable membranes.

14. The capacitive microphone according to claim 13, which comprises four movable membranes arranged in a 2×2 array configuration.

15. The capacitive microphone according to claim 6, further comprising an air flow restrictor that restricts the flow rate of air that flows in/out of the gap between the membrane and the substrate.

16. The capacitive microphone according to claim 15, wherein the air flow restrictor decreases the size of an air channel for the air to flow in/out of the gap between the membrane and the substrate.

17. The capacitive microphone according to claim 15, wherein the air flow restrictor increases the length of an air channel for the air to flow in/out of the gap between the membrane and the substrate.

18. The capacitive microphone according to claim 15, wherein the air flow restrictor comprises an insert into a groove.

19. The capacitive microphone according to claim 6, further comprising at least two air flow restrictors that restrict the flow rate of air that flows in/out of the gap between the membrane and the substrate.

* * * * *